United States Patent
Kim et al.

(10) Patent No.: US 10,303,054 B2
(45) Date of Patent: May 28, 2019

(54) PHOTOSENSITIVE RESIN COMPOSITION, PHOTOSENSITIVE RESIN LAYER USING THE SAME AND DISPLAY DEVICE

(71) Applicant: SAMSUNG SDI CO., LTD., Yongin-si, Gyeonggi-do (KR)

(72) Inventors: Sang Soo Kim, Suwon-si (KR); Jinhee Kang, Suwon-si (KR); Heekyoung Kang, Suwon-si (KR); Chang-Hyun Kwon, Suwon-si (KR); Jiyun Kwon, Suwon-si (KR); Chanwoo Kim, Suwon-si (KR); Bumjin Lee, Suwon-si (KR); Junho Lee, Suwon-si (KR); Chungbeum Hong, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 13 days.

(21) Appl. No.: 15/408,120

(22) Filed: Jan. 17, 2017

(65) Prior Publication Data
US 2018/0017866 A1 Jan. 18, 2018

(30) Foreign Application Priority Data
Jul. 13, 2016 (KR) ........................ 10-2016-0088886

(51) Int. Cl.
| | | |
|---|---|---|
| *G03F 7/027* | (2006.01) | |
| *G02B 1/04* | (2006.01) | |
| *G02B 5/22* | (2006.01) | |
| *G03F 7/004* | (2006.01) | |
| *G03F 7/029* | (2006.01) | |
| *G03F 7/032* | (2006.01) | |
| *G03F 7/033* | (2006.01) | |
| *G03F 7/035* | (2006.01) | |
| *G03F 7/16* | (2006.01) | |
| *G03F 7/20* | (2006.01) | |
| *G03F 7/32* | (2006.01) | |
| *G03F 7/40* | (2006.01) | |
| *G03F 7/00* | (2006.01) | |
| *G03F 7/037* | (2006.01) | |
| *G03F 7/075* | (2006.01) | |
| *G03F 7/105* | (2006.01) | |

(52) U.S. Cl.
CPC ............... *G03F 7/027* (2013.01); *G02B 1/04* (2013.01); *G02B 5/223* (2013.01); *G03F 7/0005* (2013.01); *G03F 7/0042* (2013.01); *G03F 7/0045* (2013.01); *G03F 7/029* (2013.01); *G03F 7/032* (2013.01); *G03F 7/033* (2013.01); *G03F 7/035* (2013.01); *G03F 7/037* (2013.01); *G03F 7/0757* (2013.01); *G03F 7/105* (2013.01); *G03F 7/16* (2013.01); *G03F 7/168* (2013.01); *G03F 7/2002* (2013.01); *G03F 7/322* (2013.01); *G03F 7/40* (2013.01); *C08L 2666/70* (2013.01)

(58) Field of Classification Search
CPC .......... G03F 7/004; G03F 7/029; G03F 7/038; G03F 7/033; G03F 7/035; G03F 7/0042; G03F 7/16; G03F 7/168; G03F 7/2002; G03F 7/322; G03F 7/38; G03F 7/40; G03F 7/005; G03F 7/027; G03F 7/0007; G02B 5/223; G02B 1/04; C08L 2666/70
USPC ................. 430/270.1, 281.1, 322, 325, 7
See application file for complete search history.

(56) References Cited

U.S. PATENT DOCUMENTS

| | | | | |
|---|---|---|---|---|
| 2009/0136878 A1* | 5/2009 | Kanna | ...................... | C09D 7/65 430/325 |
| 2010/0216073 A1* | 8/2010 | Kim | ...................... | G03F 7/0048 430/285.1 |

FOREIGN PATENT DOCUMENTS

| | | | | | |
|---|---|---|---|---|---|
| CN | 101573409 A | 11/2009 | | | |
| JP | 3364550 B2 | 1/2003 | | | |
| JP | 2004-286810 A | 10/2004 | | | |
| JP | 2008-156539 A | 7/2008 | | | |
| JP | 2008156539 A | * | 7/2008 | ............ | C09J 133/06 |
| JP | 2010-113034 A | 5/2010 | | | |
| JP | WO 2012147626 A1 | * | 11/2012 | ............ | G02B 5/201 |
| JP | 2013114008 A | * | 6/2013 | | |
| JP | 2014-157179 A | 8/2014 | | | |
| KR | 10-2015-0072055 A | 6/2015 | | | |
| KR | 10-2015-0111739 A | 10/2015 | | | |
| KR | 10-2016-0022264 A | 2/2016 | | | |
| TW | 201512778 A | 4/2015 | | | |
| WO | WO 2014194631 A1 | * | 12/2014 | ............ | C08G 73/10 |

OTHER PUBLICATIONS

Machine translation of JP 2008-156539 (no date).*
Machine translation of JP 2013-114008 (no date).*
Machine translation of WO 2014/194631 (no date).*
Machine translation of WO 2012/147626 (no date).*
Machine translation of JP 2010-113-34 (no date).*
Machine translation of KR 10-2015-007205 (no date).*
Machine translation of KR 10-2016-0022264 (no date).*
Search Report dated May 8, 2017 of the corresponding Taiwanese Patent Application No. 106101075.

(Continued)

*Primary Examiner* — Amanda C. Walke
(74) *Attorney, Agent, or Firm* — Lee & Morse, P.C.

(57) ABSTRACT

A photosensitive resin composition includes a binder resin, a black colorant, a photopolymerizable monomer, a photopolymerization initiator, and a solvent. The binder resin includes a first binder resin having a glass transition temperature of about −50° C. to about 150° C. and a second binder resin having a glass transition temperature of greater than about 150° C.

14 Claims, No Drawings

(56) References Cited

OTHER PUBLICATIONS

Provisional double patenting rejection over claims of the above-identified application; USPTO Office action dated May 14, 2018, in U.S. Appl. No. 15/498,885.
Provisional double patenting rejection over claims of the above-identified application; USPTO Office action dated Apr. 13, 2018, in U.S. Appl. No. 15/499,171.
Provisional double patenting rejection over claims of the above-identified application; USPTO Office action dated Apr. 20, 2018, in U.S. Appl. No. 15/459,328.

* cited by examiner

PHOTOSENSITIVE RESIN COMPOSITION, PHOTOSENSITIVE RESIN LAYER USING THE SAME AND DISPLAY DEVICE

CROSS-REFERENCE TO RELATED APPLICATION

Korean Patent Application No. 10-2016-0088886, filed on Jul. 13, 2016, in the Korean Intellectual Property Office, and entitled: "Photosensitive Resin Composition, Photosensitive Resin Layer Using the Same and Display Device," is incorporated by reference herein in its entirety.

BACKGROUND

1. Field

Embodiments relate to a photosensitive resin composition, a photosensitive resin layer using the same, and a display device.

2. Description of the Related Art

A photosensitive resin composition is generally used to manufacture a color filter, a liquid crystal display material, a display device such as an organic light emitting diode, a display device panel material, or the like. For example, in a color liquid crystal display, a photosensitive resin layer such as a black pixel barrier rib layer may be provided on the border between colored layers such as red, green, blue, or the like, to enhance display contrast or chromophoric effects. This photosensitive resin layer may be mainly formed of a black photosensitive resin composition.

SUMMARY

Embodiments are directed to a photosensitive resin composition including (A) a binder resin; (B) a black colorant; (C) a photopolymerizable monomer; (D) a photopolymerization initiator; and (E) a solvent, wherein the binder resin includes a first binder resin having a glass transition temperature of about −50° C. to about 150° C. and a second binder resin having a glass transition temperature of greater than about 150° C.

The first binder resin may be included in an amount of about 1 part by weight to about 900 parts by weight based on 100 parts by weight of the second binder resin.

The first binder resin may be included in an amount of about 100 parts by weight to about 800 parts by weight based on 100 parts by weight of the second binder resin.

The first binder resin may include a polyurethane-based resin, a cardo-based resin, an epoxy-based resin, a styrene-based resin, an acryl-based resin, a bisphenol A-based resin, a siloxane-based resin, or a combination thereof.

The second binder resin may include at least one selected from a polyamic acid polymer, a polyamic acid ester polymer, a polyhydroxyamide polymer, a polyimide polymer, a polybenzoxazole polymer, and a copolymer thereof.

The second binder resin may be a polyamic acid-polyimide copolymer.

The polyamic acid-polyimide copolymer may include a polyamic acid repeating unit and a polyimide repeating unit, and the polyamic acid repeating unit and the polyimide repeating unit may be included in a mole ratio of about 5:5 to about 9:1.

The polyamic acid-polyimide copolymer may have a weight average molecular weight of about 3,000 g/mol to about 20,000 g/mol.

The binder resin and the photopolymerizable monomer may be included in a weight ratio of about 55:45 to about 99:1.

The photopolymerizable monomer may include a compound including at least two functional groups represented by Chemical Formula 1.

[Chemical Formula 1]

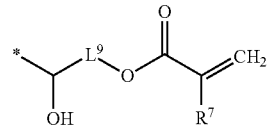

In Chemical Formula 1, $R^7$ is a hydrogen atom or a substituted or unsubstituted C1 to C10 alkyl group, and $L^9$ is a single bond or a substituted or unsubstituted C1 to C10 alkylene group.

The compound including at least two functional groups represented by Chemical Formula 1 may be a compound represented by Chemical Formula 2 or Chemical Formula 3.

[Chemical Formula 2]

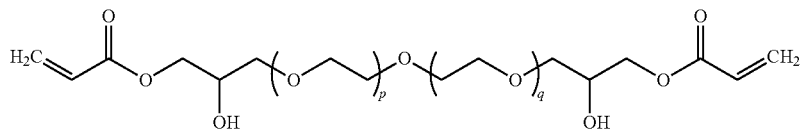

[Chemical Formula 3]

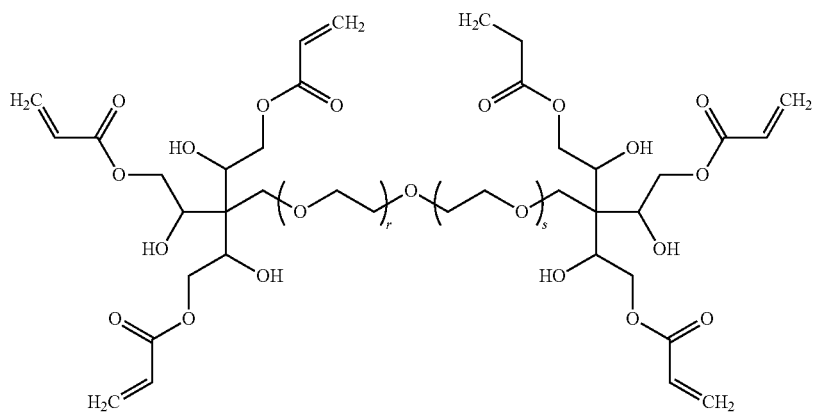

In Chemical Formula 2 and Chemical Formula 3, p, q, r, and s are independently an integer ranging from 1 to 10.

The black colorant may be an organic black pigment.

The black colorant may further include carbon black in addition to the organic black pigment.

The carbon black may be included in an amount of about 10 parts by weight to about 60 parts by weight based on 100 parts by weight of the organic black pigment.

The photosensitive resin composition may include about 1 wt % to about 10 wt % of the (A) binder resin; about 1 wt % to about 20 wt % of the (B) black colorant; about 0.3 wt % to about 10 wt % of the (C) photopolymerizable monomer; about 0.1 wt % to about 5 wt % of the (D) photopolymerization initiator; and a balance amount of the (E) solvent based on a total amount of the photosensitive resin composition.

The photosensitive resin composition may further include an additive of malonic acid, 3-amino-1,2-propanediol, a silane-based coupling agent, a leveling agent, surfactant, a radical polymerization initiator, or a combination thereof.

A photosensitive resin layer may be manufactured using the photosensitive resin composition.

A display device may include the photosensitive resin layer.

The display device may be an organic light emitting diode (OLED).

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

As used herein, when a specific definition is not otherwise provided, the term "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C6 to C20 arylalkyl group, the term "alkylene group" refers to a C1 to C20 alkylene group, the term "arylene group" refers to a C6 to C20 arylene group, "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

As used herein, when a specific definition is not otherwise provided, the term "substituted" refers to replacement of at least one hydrogen by a substituent selected from a halogen atom (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof.

As used herein, when a specific definition is not otherwise provided, "hetero" refers to inclusion of at least one heteroatom of N, O, S, and P in chemical formulae.

As used herein, when specific definition is not otherwise provided, "(meth)acrylate" refers to "acrylate" and "methacrylate," and "(meth)acrylic acid" refers to "acrylic acid" and "methacrylic acid."

As used herein, when a definition is not otherwise provided, the term "combination" refers to mixing or copolymerization. In addition, "copolymerization" refers to block copolymerization or random copolymerization, and "copolymer" refers to a block copolymer or a random copolymer.

As used herein, when specific definition is not otherwise provided, an unsaturated bond includes a bond between other atoms such as a carbonyl bond, or an azo bond as well as a multi-bond between carbon-carbon atoms.

In the chemical formula of the present specification, unless a specific definition is otherwise provided, when a chemical bond is not drawn where a bond should be to provide proper valency, it is to be understood that a hydrogen is bonded at such position.

As used herein, the term "cardo-based resin" refers to a resin including at least one functional group selected from Chemical Formula 5-1 to Chemical Formula 5-11 in its backbone.

As used herein, when specific definition is not otherwise provided, "*" indicates a point where a same or different atom or chemical formula is linked.

A photosensitive resin composition according to an embodiment includes (A) a binder resin, (B) a black colorant, (C) a photopolymerizable monomer, (D) a photopolymerization initiator, and (E) a solvent. The binder resin includes a first binder resin having a glass transition temperature of about −50° C. to about 150° C. and a second binder resin having a glass transition temperature of greater than about 150° C.

A general photosensitive resin layer composition used for a barrier rib material of a display device such as an organic light emitting diode, or the like, may have a forward tapered angle (a taper angle of less than about 90°) to fill a gap between an anode and a barrier rib for deposition of an EL device. However, a photosensitive resin layer formed of a conventional photosensitive resin composition may be transparent or may have a color such as yellow, reddish brown, or the like. The photosensitive resin layer may not realize black since incident light into the display device may be reflected by a metal layer when the display device is powered off, thus deteriorating external visibility and luminance.

However, the photosensitive resin composition according to an embodiment includes a first binder resin having a glass transition temperature of about −50° C. to about 150° C. and a second binder resin having a glass transition temperature of greater than about 150° C. in a predetermined ratio. Thus, the photosensitive resin composition may largely improve processability and reliability of a photosensitive resin layer. The photosensitive resin composition may include an organic black pigment alone or a mixture of the organic black pigment and carbon black in a predetermined ratio as a black colorant and thus may improve light-blocking properties.

Hereinafter, each component is described.

(A) Binder Resin

The binder resin in the photosensitive resin composition according to an embodiment may include a first binder resin having a glass transition temperature of about −50° C. to about 150° C. and a second binder resin having a glass transition temperature of greater than about 150° C. Accordingly, the binder resin may suppress a taper angle from being increased after curing the photosensitive resin composition including a colorant such as a pigment, a dye, or the like, and may maintain a forward taper angle after the curing and thus much improve deposition processability and reliability of a display device.

The first binder resin having a glass transition temperature of about −50° C. to about 150° C. may be included in an amount of about 1 part by weight to about 400 parts by weight based on 100 parts by weight of the second binder resin having a glass transition temperature of greater than about 150° C. The taper angle may maintain a forward taper angle after a curing process. For example, the taper angle may be less than or equal to about 80°.

For example, the first binder resin having a glass transition temperature of about −50° C. to about 150° C. may be included in an amount of about 1 part by weight to about 900 parts by weight based on 100 parts by weight of the second binder resin having a glass transition temperature of greater than about 150° C. The taper angle may become a more forwardly tapered angle after a curing process. For example, when the first binder resin is included in an amount of about 100 parts by weight to about 800 parts by weight based on 100 parts by weight of the second binder resin, the taper angle may be less than or equal to about 60°, or, for example, less than or equal to about 55°.

The first binder resin may include a polyurethane-based resin, a cardo-based resin, an epoxy-based resin, a styrene-based resin, an acryl-based resin, a bisphenol A-based resin, a siloxane-based resin, or a combination thereof.

For example, the first binder resin may include a polyurethane-based resin, an epoxy-based resin, a styrene-based resin, an acryl-based resin, a bisphenol A-based resin, a siloxane-based resin, or a combination thereof. In this case, sensitivity may be further improved.

The polyurethane-based resin may include a repeating unit represented by Chemical Formula 4, as an example.

[Chemical Formula 4]

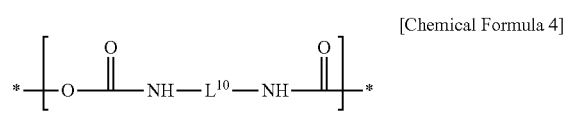

In Chemical Formula 4, $L^{10}$ is a substituted or unsubstituted C1 to C30 divalent organic group.

For example, the $L^{10}$ may be a substituted or unsubstituted C1 to C30 divalent organic group including a heteroatom.

For example, the $L^{10}$ may be a substituted or unsubstituted C1 to C30 divalent organic group without a heteroatom.

The cardo-based resin may be represented by Chemical Formula 5.

In Chemical Formula 5, $R^{51}$ and $R^{52}$ are independently a hydrogen atom or a substituted or unsubstituted (meth)acryloyloxy alkyl group, $R^{53}$ and $R^{54}$ are independently a hydrogen atom, a halogen atom, or a substituted or unsubstituted C1 to C20 alkyl group, and $Z^1$ is one of a single bond, O, CO, $SO_2$, $CR^{55}R^{56}$, $SiR^{57}R^{58}$ (wherein, $R^{55}$ to $R^{58}$ are independently a hydrogen atom, or a substituted or unsubstituted C1 to C20 alkyl group), or linking groups represented by Chemical Formula 5-1 to Chemical Formula 5-11.

[Chemical Formula 5-1]

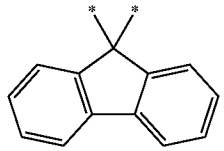

[Chemical Formula 5-2]

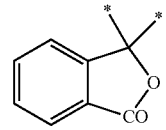

[Chemical Formula 5-3]

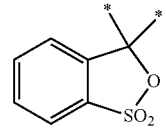

[Chemical Formula 5-4]

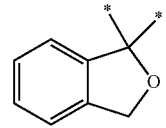

[Chemical Formula 5-5]

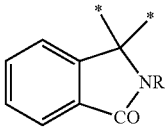

In Chemical Formula 5-5, $R^a$ is a hydrogen atom, an ethyl group, $C_2H_4Cl$, $C_2H_4OH$, $CH_2CH=CH_2$, or a phenyl group.

[Chemical Formula 5-6]

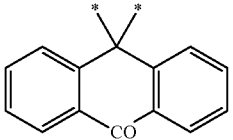

[Chemical Formula 5]

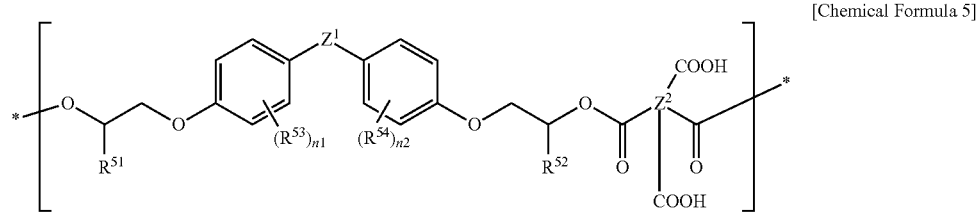

[Chemical Formula 5-7]

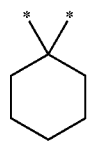

[Chemical Formula 5-8]

[Chemical Formula 5-9]

[Chemical Formula 5-10]

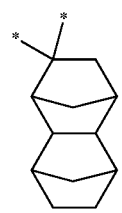

[Chemical Formula 5-11]

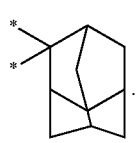

In Chemical Formula 5, $Z^2$ is an acid dianhydride residual group, and n1 and n2 are independently an integer ranging from 0 to 4.

A weight average molecular weight of the cardo-based resin may be about 500 g/mol to about 50,000 g/mol, or, for example about 1,000 g/mol to about 30,000 g/mol. When the cardo-based binder resin has a weight average molecular weight within the range, a pattern may be well formed without a residue during manufacture of a light-blocking layer and without loss of a film thickness during development.

The cardo-based binder resin may include a functional group represented by Chemical Formula 6 at at least one terminal end.

[Chemical Formula 6]

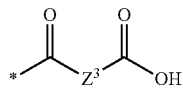

In Chemical Formula 6, $Z^3$ is represented by Chemical Formula 6-1 to Chemical Formula 6-7.

[Chemical Formula 6-1]

In Chemical Formula 6-1, $R^b$ and $R^c$ are independently hydrogen, a substituted or unsubstituted C1 to C20 alkyl group, an ester group, or an ether group.

[Chemical Formula 6-2]

[Chemical Formula 6-3]

[Chemical Formula 6-4]

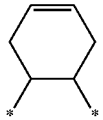

[Chemical Formula 6-5]

In Chemical Formula 6-5, $R^d$ is O, S, NH, a substituted or unsubstituted C1 to C20 alkylene group, C1 to C20 alkylamine group, or C2 to C20 allylamine group.

[Chemical Formula 6-6]

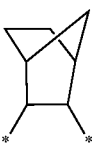

[Chemical Formula 6-7]

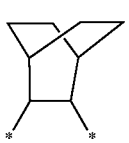

The cardo-based resin may be, prepared by, for example, mixing at least two from a group consisting of a fluorene-containing compound such as 9,9-bis(4-oxiranylmethoxyphenyl)fluorene, or the like, an anhydride compound such as benzene tetracarboxylic acid dianhydride, naphthalene tetracarboxylic acid dianhydride, biphenyltetracarboxylic acid dianhydride, benzophenone tetracarboxylic acid dianhydride, pyromellitic dianhydride, cyclobutanetetracarboxylic acid dianhydride, perylenetetracarboxylic acid dianhydride, tetrahydrofuran tetracarboxylic acid dianhydride, tetrahydrophthalic anhydride, or the like, a glycol compound such as ethylene glycol, propylene glycol, polyethylene glycol, or the like, an alcohol compound such as methanol, ethanol, propanol, n-butanol, cyclohexanol, benzylalcohol, or the like, a solvent-based compound such as propylene glycol methylethylacetate, N-methylpyrrolidone, or the like, a phosphorus compound such as triphenylphosphine, or the like, and an amine or ammonium salt compound such as tetramethylammonium chloride, tetraethylammonium bromide, benzyldiethylamine, triethylamine, tributylamine, benzyltriethylammonium chloride, or the like.

The epoxy-based resin may be represented by Chemical Formula 7 or 8, as examples.

[Chemical Formula 7]

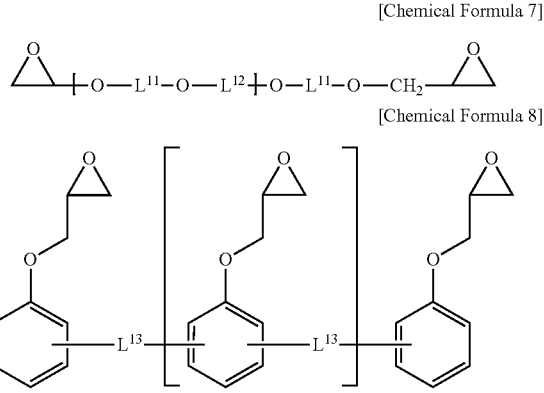

[Chemical Formula 8]

In Chemical Formula 7 and Chemical Formula 8, $L^{11}$ is a substituted or unsubstituted C1 to C30 divalent organic group, $L^{12}$ is a substituted or unsubstituted C1 to C20 divalent organic group, and $L^{13}$ is a substituted or unsubstituted C1 to C10 divalent organic group.

For example, $L^{11}$ to $L^{13}$ may independently include or not include a heteroatom.

For example, $L^{12}$ may have a hydroxy group as a substituent.

For example, the epoxy-based resin may be represented by Chemical Formula 7-1 or Chemical Formula 8-1, as examples.

The styrene-based resin may include a repeating unit represented by Chemical Formula 9, as an example.

[Chemical Formula 9]

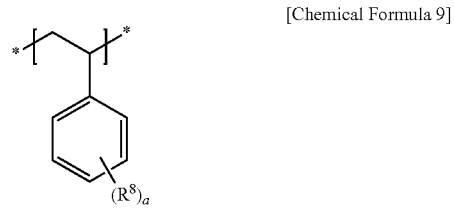

In Chemical Formula 9, $R^8$ is a hydrogen atom, a carboxyl group, or a substituted or unsubstituted C1 to C10 alkyl group, and a is an integer ranging from 0 to 5.

For example, the styrene-based resin may include repeating units represented by Chemical Formula 10 and/or Chemical Formula 11, as examples.

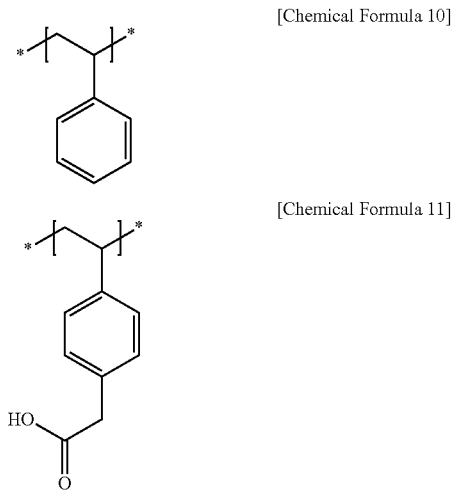

[Chemical Formula 10]

[Chemical Formula 11]

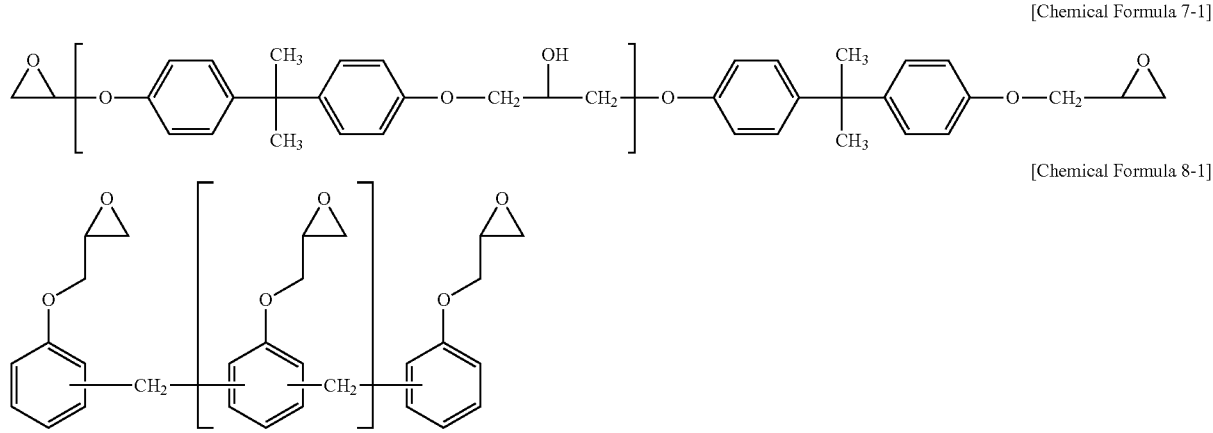

[Chemical Formula 7-1]

[Chemical Formula 8-1]

A weight average molecular weight of the epoxy-based resin may be about 1,000 g/mol to about 50,000 g/mol, or, for example, about 2,000 g/mol to about 30,000 g/mol.

A weight average molecular weight of the styrene-based resin may be about 3,000 g/mol to about 50,000 g/mol, or, for example, about 5,000 g/mol to about 30,000 g/mol.

The acryl-based resin may include a repeating unit represented by Chemical Formula 12, as an example.

[Chemical Formula 12]

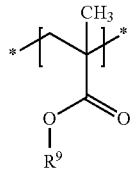

In Chemical Formula 12, $R^9$ is a hydrogen atom or a substituted or unsubstituted C1 to C10 alkyl group.

For example, the acryl-based resin may include at least two repeating units represented by Chemical Formula 12-1 to Chemical Formula 12-6, as an example.

For example, the acryl-based resin may include one or more of the repeating units represented by Chemical Formula 12-1 to Chemical Formula 12-6.

[Chemical Formula 12-1]

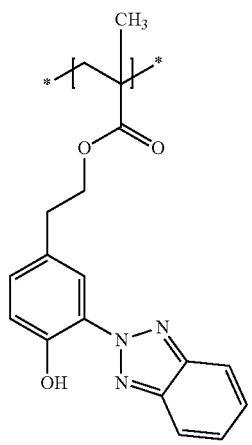

[Chemical Formula 12-2]

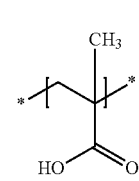

[Chemical Formula 12-3]

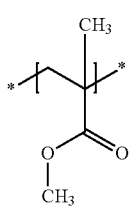

[Chemical Formula 12-4]

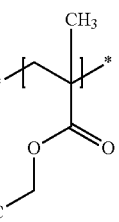

[Chemical Formula 12-5]

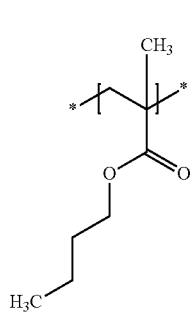

[Chemical Formula 12-6]

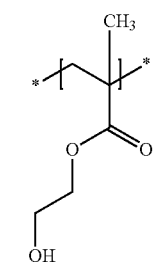

The bisphenol A-based resin may include repeating units represented by Chemical Formula 13 and/or Chemical Formula 14, as examples.

[Chemical Formula 13]

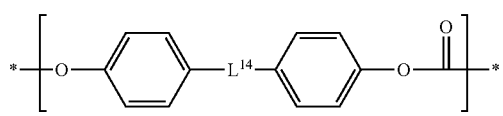

[Chemical Formula 14]

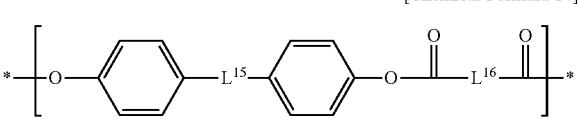

In Chemical Formula 13 and Chemical Formula 14, $L^{14}$ to $L^{16}$ are independently a substituted or unsubstituted C1 to C20 alkylene group, or a substituted or unsubstituted C6 to C20 arylene group.

For example, the bisphenol A-based resin may include a repeating unit represented by Chemical Formula 15.

[Chemical Formula 15]

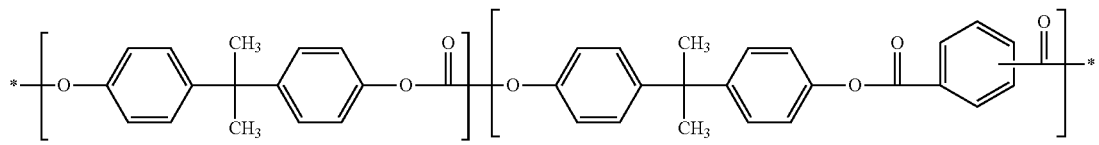

A weight average molecular weight of the bisphenol A-based resin may be about 1,000 g/mol to about 50,000 g/mol, or, for example, about 2,000 g/mol to about 30,000 g/mol.

The siloxane-based resin may be represented by Chemical Formula 16, as an example.

[Chemical Formula 16]

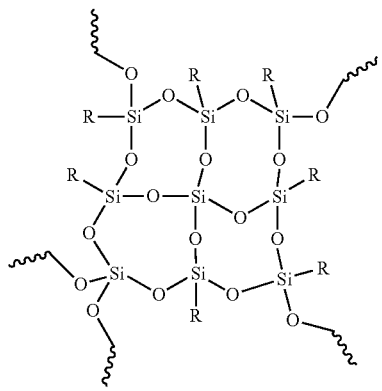

The second binder resin may include at least one selected from a polyamic acid polymer, a polyamic acid ester polymer, a polyhydroxyamide polymer, a polyimide polymer, a polybenzoxazole polymer, and a copolymer thereof.

For example, the second binder resin may be a polyamic acid-polyimide copolymer.

The binder resin included in a photosensitive resin composition according to an embodiment may simultaneously have a polyimide unit soluble in an organic solvent and a polyamic acid unit having a polyimide precursor structure, and thus may provide a black photosensitive resin layer having high heat resistance, which has not been generally realized.

The black photosensitive resin layer having excellent heat resistance and pattern-forming capability may be provided by copolymerizing polyimide, a main structure of a polymer in order to prevent excessive dissolution characteristics of polyamic acid, that is a polyimide precursor, in an alkali aqueous solution and controlling solubility, thus obtaining appropriate solubility between an exposed region and a non-exposed region during a pattern formation.

For example, the polyamic acid-polyimide copolymer may include a polyamic acid repeating unit and a polyimide repeating unit. The polyamic acid repeating unit and the polyimide repeating unit may be included in a mole ratio of about 5:5 to about 9:1, or, for example, about 5:5 to about 8:2, or, for example, about 5:5 to about 7:3, or, for example, about 5:5 to about 6:4. When the polyamic acid repeating unit and the polyimide repeating unit are included in a mole ratio within the ranges, a step of about 1 µm may be easily realized, and a copolymerization resin having excellent cross-linking characteristics may be obtained. For example, when the polyimide repeating unit and the polyamic acid repeating unit are used out of the mole ratio range in the copolymerization resin, that is, when the polyimide repeating unit is more included than the polyamic acid repeating unit, developability of the composition may be deteriorated.

As for the copolymer, a mole ratio of the polyimide unit already having an imidization structure in a solution state may be adjusted to easily control solubility of a photosensitive resin itself in an alkali aqueous solution. In this way, the photosensitive resin may have appropriate solubility in the alkali aqueous solution by controlling a copolymerization ratio between an alkali-soluble imide structure and a polyamic acid structure of a polyimide precursor. Accordingly excellent heat resistance may be obtained by forming a fine pattern by introducing a cross-linking functional group at the terminal end (and/or a chain) of a copolymerization resin to cross-link an exposed region when light in a UV region is radiated by a light source and developing a non-exposed region and then, thermally curing the pattern at a high temperature of greater than or equal to about 250° C.

For example, the polyamic acid-polyimide copolymer may have a weight average molecular weight of about 3,000 g/mol to about 20,000 g/mol, or, for example, about 4,000 g/mol to about 10,000 g/mol. When the copolymer has a weight average molecular weight within the ranges, excellent pattern-forming capability may be obtained, and a thin film may having excellent mechanical thermal characteristics may provided.

The copolymer may have an unsaturated double bond at at least one terminal end, or, for example, at both terminal ends of the copolymerization resin. The unsaturated double bond may be present in the middle of a chain of the copolymerization resin in addition to the terminal ends of the copolymer. The unsaturated double bond at the terminal end (and/or in the middle of a chain) may work as a cross-linking functional group and thus may improve cross-linking characteristics of the copolymer. For example, a photosensitive resin composition having a much more excellent contrast may be realized by introducing a monomer cross-linked by the photopolymerization initiator at the terminal end of a main structure (and/or in the middle of a chain) in order to apply cross-linking characteristics through exposure of the copolymer itself. The monomer cross-linked by the photopolymerization initiator may be represented by one selected from Chemical Formula 1 to Chemical Formula 4.

For example, the unsaturated double bond may be derived from a compound selected from Chemical Formula 17 to Chemical Formula 20, as examples.

[Chemical Formula 17]

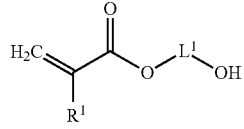

-continued

[Chemical Formula 18]

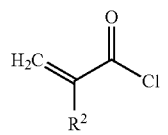

[Chemical Formula 19]

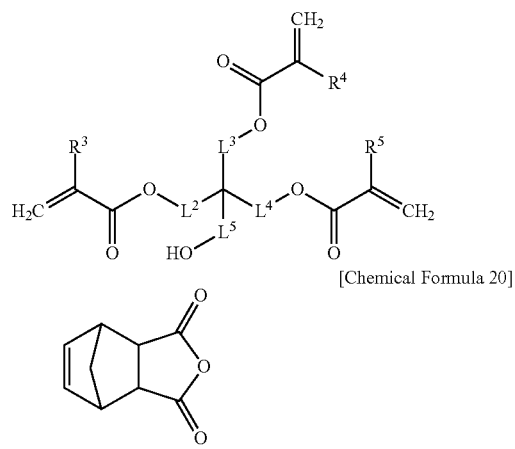

[Chemical Formula 20]

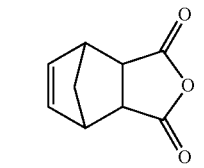

In Chemical Formula 17 to Chemical Formula 19, $R^1$ to $R^5$ are independently a hydrogen atom or a substituted or unsubstituted C1 to C10 alkyl group, and $L^1$ to $L^5$ are independently a single bond or a substituted or unsubstituted C1 to C10 alkylene group.

For example, the copolymer may be represented by Chemical Formula 21.

[Chemical Formula 21]

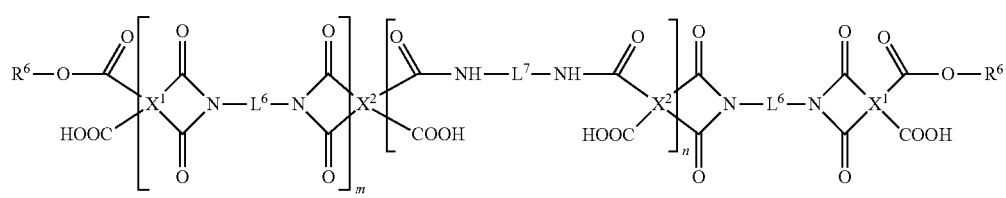

In Chemical Formula 21, $X^1$ and $X^2$ are independently a substituted or unsubstituted tetravalent alicyclic organic group, or a substituted or unsubstituted tetravalent aromatic organic group, $L^6$ and $L^7$ are independently a single bond, a substituted or unsubstituted C1 to C10 alkylene group, a substituted or unsubstituted C3 to C10 cycloalkylene group, or a substituted or unsubstituted C6 to C20 arylene group, $R^6$ is a substituted or unsubstituted acryl group, a substituted or unsubstituted methacryl group, or a substituted or unsubstituted norbornene group, and m and n are independently an integer ranging from 1 to 100,000.

For example, the tetravalent aromatic organic group may be represented by Chemical Formula 22.

[Chemical Formula 22]

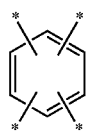

The C6 to C20 arylene group may include a linking group represented by Chemical Formula 23.

[Chemical Formula 23]

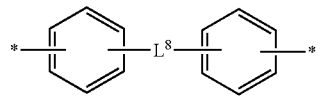

In Chemical Formula 23, $L^8$ is a substituted or unsubstituted C1 to C8 alkylene group.

In some implementations, the binder resin and the post-described photopolymerizable monomer may be included in a weight ratio of about 55:45 to about 99:1. When the binder resin and the photopolymerizable monomer are included in the weight ratio, a development rate may be controlled and thus a development margin may be improved.

The binder resin may be included in an amount of about 1 wt % to about 10 wt %, or, for example, about 1 wt % to about 7 wt % based on a total amount of the photosensitive resin composition. When the binder resin is included within the ranges, excellent sensitivity, developability, resolution, and pattern linearity may be obtained.

(B) Black Colorant

The black colorant in the photosensitive resin composition according to an embodiment may include an organic black pigment in order to improve light-blocking properties and realize black easily.

In general, only carbon black is used as a black colorant in order to improve light-blocking properties. However, when the carbon black is used alone, although excellent optical density may be obtained, other characteristics, e. g., electrical characteristics, or the like, may be deteriorated.

According to an embodiment, when an organic black pigment is used as the black colorant, light-blocking properties may be deteriorated relatively more than when the carbon black is used alone but may provide sufficient light-blocking performance and simultaneously further improve the other characteristics such as electrical characteristics, or the like.

For example, the black colorant in the photosensitive resin composition according to an embodiment may further include carbon black along with the organic black pigment and may further improve light-blocking properties. Herein, the carbon black may be included in an amount of about 10 parts by weight to about 60 parts by weight, or, for example, about 20 parts by weight to about 60 parts by weight based on 100 parts by weight of the organic black pigment. When the carbon black is included within the weight ranges, excellent transmittance of light in a near infrared region as well as the light-blocking properties may be obtained. Thus processability may be improved. In general, when a photosensitive resin composition has transmittance of a near infrared ray at a predetermined level, for example, greater than or equal to about 12%, the photosensitive resin composition may be aligned and patterned by easily performing an exposure process through alignment. Accordingly, the near infrared ray transmittance may be one of standards that determine whether the photosensitive resin composition may be patterned or not.

When the organic black pigment or a mixture of the organic black pigment and carbon black that is an inorganic black pigment is used as the black colorant, a dispersing agent may be used in order to disperse the pigment. The pigment may be pretreated with the dispersing agent on the surface or the dispersing agent may be added with the pigment to prepare the composition.

The dispersing agent may be a non-ionic dispersing agent, an anionic dispersing agent, a cationic dispersing agent, or the like. Examples of the dispersing agent include polyalkylene glycol and esters thereof, polyoxyalkylene, a polyhydric alcohol ester alkylene oxide addition product, an alcohol alkylene oxide addition product, a sulfonate ester, a sulfonate salt, a carboxylate ester, a carboxylate salt, an alkyl amide alkylene oxide addition product, alkyl amine, or the like. These may be used alone or as a mixture of two or more.

Commercially available examples of the dispersing agent may include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, and DISPERBYK-2001, made by BYK Co., Ltd., EFKA-47, EFKA-47EA, EFKA-48, EFKA-49, EFKA-100, EFKA-400, EFKA-450 made by EFKA Chemicals Co., Solsperse 5000, Solsperse 12000, Solsperse 13240, Solsperse 13940, Solsperse 17000, Solsperse 20000, Solsperse 24000GR, Solsperse 27000, Solsperse 28000, or the like made by Zeneka Co., or PB711, PB821, or the like made by Ajinomoto Inc.

The dispersing agent may be included in an amount of about 0.1 wt % to about 15 wt % based on a total amount of the photosensitive resin composition. When the dispersing agent is included within the range, the composition may have excellent stability, developability, and pattern-forming capability due to improved dispersion properties during manufacture of a black barrier rib material.

The pigment may be pre-treated using a water-soluble inorganic salt and a wetting agent. When the pigment is pre-treated, an average particle diameter of the pigment may become finer.

The pre-treatment may be performed by kneading the pigment with a water-soluble inorganic salt and a wetting agent and then, filtering and washing the kneaded pigment.

The kneading may be performed at a temperature of about 40° C. to about 100° C. The filtering and washing may be performed by filtering the pigment after washing away an inorganic salt with water or the like.

Examples of the water-soluble inorganic salt may be sodium chloride, potassium chloride, or the like. The wetting agent may allow the pigment to be uniformly mixed with the water-soluble inorganic salt and to be pulverized. Examples of the wetting agent include alkylene glycol monoalkyl ethers such as ethylene glycol monoethylether, propylene glycol monomethylether, diethylene glycol monomethylether, or the like, and alcohols such as ethanol, isopropanol, butanol, hexanol, cyclohexanol, ethylene glycol, diethylene glycol, polyethylene glycol, glycerine polyethylene glycol, or the like. These may be used alone or as a mixture of two or more.

The pigment after the kneading may have an average particle diameter ranging from about 5 nm to about 200 nm, or, for example about 5 nm to about 150 nm. When the pigment has an average particle diameter within the range, stability of the pigment dispersion liquid may be improved and pixel resolution may not be deteriorated.

The pigment may be used in a form of pigment dispersion liquid including the dispersing agent and a solvent which will be described below. The pigment dispersion liquid may include a solid pigment, a dispersing agent, and a solvent. The solid pigment may be included in an amount of about 5 wt % to about 40 wt %, or, for example, about 8 wt % to about 30 wt %, based on a total amount of the pigment dispersion liquid.

The black colorant may be included in an amount of about 1 wt % to about 20 wt %, or, for example, about 2 wt % to about 15 wt %, based on a total amount of the photosensitive resin composition. When the black colorant is included within the ranges, coloring effects and development performance may be improved.

(C) Photopolymerizable Monomer

The photopolymerizable monomer in the photosensitive resin composition according to an embodiment may be a single compound or a mixture of two or more different kinds of compounds.

When the photopolymerizable monomer is the mixture of two or more kinds of compounds, one of the two kinds of compounds may be a compound including at least two functional groups represented by Chemical Formula 1.

[Chemical Formula 1]

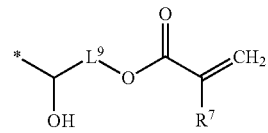

In Chemical Formula 1, $R^7$ is a hydrogen atom or a substituted or unsubstituted C1 to C10 alkyl group, and $L^9$ is a single bond or a substituted or unsubstituted C1 to C10 alkylene group.

For example, the compound including at least two functional groups represented by Chemical Formula 1 may include 2 to 6 functional groups represented by Chemical Formula 1. In this case, during exposure of a pattern forming process, sufficient polymerization may occur and a pattern having improved heat resistance, light resistance, and chemical resistance may be formed.

For example, the compound including at least two functional groups represented by Chemical Formula 1 may be a compound represented by Chemical Formula 2 or Chemical Formula 3.

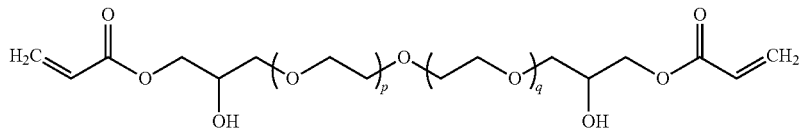

[Chemical Formula 2]

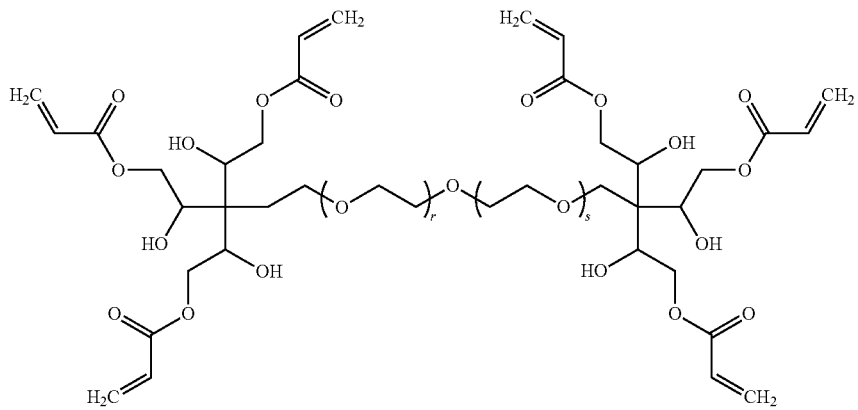

[Chemical Formula 3]

In Chemical Formula 2 and Chemical Formula 3, p, q, r, and s are independently an integer ranging from 1 to 10.

When the photopolymerizable monomer is a mixture of two or more kinds of compounds, the other compound of the two kinds of compounds may be a monofunctional or multi-functional ester compound of (meth)acrylic acid having at least one ethylenic unsaturated double bond.

The monofunctional or multi-functional ester compound of the (meth)acrylic acid having at least one ethylenic unsaturated double bond may be, for example, ethylene glycol di(meth)acrylate, diethylene glycol di(meth)acrylate, triethylene glycol di(meth)acrylate, propylene glycol di(meth)acrylate, neopentylglycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritoltri(meth)acrylate, pentaerythritoltetra(meth)acrylate, pentaerythritol hexa(meth)acrylate, dipentaerythritol di(meth)acrylate, dipentaerythritoltri(meth)acrylate, dipentaerythritolpenta(meth)acrylate, dipentaerythritol hexa(meth)acrylate, bisphenol A epoxy(meth)acrylate, ethylene glycolmonomethylether (meth)acrylate, trimethylolpropanetri(meth)acrylate, tris(meth)acryloyloxyethyl phosphate, novolac epoxy (meth)acrylate, or a combination thereof.

Commercially available examples of the monofunctional or multi-functional ester compound of the (meth)acrylic acid having at least one ethylenic unsaturated double bond are as follows. Examples of the mono-functional (meth)acrylic acid ester may include Aronix M-101®, M-111®, M-114 ® (Toagosei Chemistry Industry Co., Ltd.), KAYARAD TC-110S®, TC-120S® (Nippon Kayaku Co., Ltd.), V-158®, V-2311® (Osaka Organic Chemical Ind., Ltd.), or the like. Examples of a difunctional (meth)acrylic acid ester may include Aronix M-210®, M-240®, M-6200 ® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), or the like. Examples of a tri-functional (meth)acrylic acid ester may include Aronix M-309®, M-400®, M-405®, M-450®, M-7100®, M-8030®, M-8060® (Toagosei Chemistry Industry Co., Ltd.), KAYARAD TMPTA®. DPCA-20®, DPCA-30®, DPCA-60®, DPCA-120® (Nippon Kayaku Co., Ltd.), V-295®, V-300®, V-360®, V-GPT®, V-3PA®, V-400® (Osaka Yuki Kayaku Kogyo Co. Ltd.), or the like. The products may be used alone or as a mixture of two or more.

The photopolymerizable monomer may be treated with acid anhydride to improve developability.

The photopolymerizable monomer may be included in an amount of about 0.3 wt % to about 10 wt %, or, for example, about 0.5 wt % to about 10 wt %, or, for example, about 0.5 wt % to about 5 wt % based on a total amount of the photosensitive resin composition. When the photopolymerizable monomer is included within the ranges, the reactive unsaturated compound may be sufficiently cured during exposure in a pattern-forming process and may have excellent reliability Thus, may form a pattern having excellent heat resistance, light resistance, and chemical resistance and also, excellent resolution and close-contacting properties may be formed.

(D) Photopolymerization Initiator

A photosensitive resin composition according to an embodiment may include a photopolymerization initiator. The photopolymerization initiator may include an acetophenone-based compound, a benzophenone-based compound, a thioxanthone-based compound, a benzoin-based compound, a triazine-based compound, an oxime-based compound, or the like.

Examples of the acetophenone-based compound may include 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, or the like.

Examples of the benzophenone-based compound may include benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, or the like.

Examples of the thioxanthone-based compound may be thioxanthone, 2-chlorothioxanthone, 2-methylthioxanthone, isopropyl thioxanthone, 2,4-diethyl thioxanthone, 2,4-diisopropyl thioxanthone, or the like.

Examples of the benzoin-based compound may include benzoin, benzoin methyl ether, benzoin ethyl ether, benzoin isopropyl ether, benzoin isobutyl ether, benzyldimethylketal, or the like.

Examples of the triazine-based compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, or the like.

Examples of the oxime-based compound may include an O-acyl oxime-based compound, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, or the like. Examples of the O-acyl oxime-based compound may include 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-oneoxime-O-acetate, or 1-(4-phenylsulfanyl phenyl)-butan-1-oneoxime-O-acetate.

The photopolymerization initiator may further include a carbazole-based compound, a diketone-based compound, a sulfonium borate-based compound, a diazo-based compound, an imidazole-based compound, a biimidazole-based compound, or the like.

The photopolymerization initiator may be included in an amount of about 0.1 wt % to about 5 wt %, or, for example, about 0.1 wt % to about 3 wt %, based on a total amount of the photosensitive resin composition. When the photopolymerization initiator is included within the ranges, the composition may be sufficiently photopolymerized when exposed to light during the pattern-forming process for preparing a color filter, providing excellent sensitivity and improving transmittance.

(E) Solvent

The solvent may be a material having compatibility with the binder resin, the black colorant, the photopolymerizable monomer, and the photopolymerization initiator, without reacting therewith.

Examples of the solvent may include alcohols such as methanol, ethanol, or the like, ethers such as dichloroethyl ether, n-butyl ether, diisoamyl ether, methylphenyl ether, tetrahydrofuran, or the like, glycol ethers such as ethylene glycol monomethylether, ethylene glycol monoethylether, diethylene glycolmethylethylether, or the like, cellosolve acetates such as methyl cellosolve acetate, ethyl cellosolve acetate, diethyl cellosolve acetate, or the like, carbitols such as methylethyl carbitol, diethyl carbitol, diethylene glycol monomethylether, diethylene glycol monoethylether, diethylene glycol dimethylether, diethylene glycol methylethylether, diethylene glycol diethylether, or the like, propylene glycol alkylether acetates such as propylene glycol methylether acetate, propylene glycol propylether acetate, or the like, aromatic hydrocarbons such as toluene, xylene or the like, ketones such as methylethylketone, cyclohexanone, 4-hydroxy-4-methyl-2-pentanone, methyl-n-propylketone, methyl-n-butylketone, methyl-n-amylketone, 2-heptanone, or the like, saturated aliphatic monocarboxylic acid alkyl esters such as ethyl acetate, n-butyl acetate, isobutyl acetate, or the like, lactate esters such as methyl lactate, ethyl lactate, or the like, oxy acetic acid alkyl esters such as oxy methyl acetate, oxy ethyl acetate, butyl oxyacetate, or the like, alkoxy acetic acid alkyl esters such as methoxy methyl acetate, methoxy ethyl acetate, methoxy butyl acetate, ethoxy methyl acetate, ethoxy ethyl acetate, or the like, 3-oxy propionic acid alkyl esters such as 3-oxy methyl propionate, 3-oxy ethyl propionate, or the like, 3-alkoxy propionic acid alkyl esters such as 3-methoxy methyl propionate, 3-methoxy ethyl propionate, 3-ethoxy ethyl propionate, 3-ethoxy methyl propionate, or the like, 2-oxy propionic acid alkyl esters such as 2-oxy methyl propionate, 2-oxy ethyl propionate, 2-oxy propyl propionate, or the like, 2-alkoxy propionic acid alkyl esters such as 2-methoxy methyl propionate, 2-methoxy ethyl propionate, 2-ethoxy ethyl propionate, 2-ethoxy methyl propionate, or the like, 2-oxy-2-methyl propionic acid esters such 2-oxy-2-methyl methyl propionate, 2-oxy-2-methyl ethyl propionate, or the like, monooxy monocarboxylic acid alkyl esters of 2-alkoxy-2-methyl alkyl propionates such as 2-methoxy-2-methyl methyl propionate, 2-ethoxy-2-methyl ethyl propionate, or the like, esters such as 2-hydroxy ethyl propionate, 2-hydroxy-2-methyl ethyl propionate, hydroxy ethyl acetate, 2-hydroxy-3-methyl methyl butanoate, or the like, or ketonate esters such as ethyl pyruvate, or the like. Additionally, a high boiling point solvent such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, or the like may be also used.

Considering miscibility and reactivity, glycol ethers such as ethylene glycol monoethylether, ethylene glycol diethylether, or the like, ethylene glycol alkylether acetates such as ethylcellosolveacetate, or the like, esters such as 2-hydroxy ethyl propionate, or the like, carbitols such as diethylene glycolmonomethylether, diethylene glycolethylmethylether, propylene glycolmonomethylether, or the like, propylene glycol alkylether acetates such as propylene glycolmonomethyl ether acetate, propylene glycolpropyletheracetate, or the like may be used.

The solvent may be used in a balance amount, for example, about 20 wt % to about 95 wt %, or, for example, about 30 wt % to about 85 wt % based on a total amount of the photosensitive resin composition. When the solvent is included within the range, the photosensitive resin composition may have an appropriate viscosity resulting in improvement of coating characteristics of a black pixel barrier rib layer.

(F) Other Additive

The photosensitive resin composition may further include an additive including malonic acid, 3-amino-1,2-propanediol, a silane-based coupling agent, a leveling agent, a surfactant, a radical polymerization initiator, or a combination thereof.

The silane-based coupling agent may have a reactive substituent such as a vinyl group, a carboxyl group, a methacryloxy group, an isocyanate group, an epoxy group, or the like, in order to improve close-contacting properties with a substrate.

Examples of the silane-based coupling agent may include trimethoxysilylbenzoic acid, γ-methacryloxypropyltrimethoxysilane, vinyltriacetoxysilane, vinyltrimethoxysilane, γ-isocyanatepropyltriethoxysilane, γ-glycidoxypropyltrimethoxysilane, β-(3,4-epoxycyclohexyl) ethyltrimethoxysilane, or the like. These may be used alone or in a mixture of two or more.

The silane-based coupling agent may be included in an amount of about 0.01 parts by weight to about 10 parts by weight based on 100 parts by weight of the photosensitive resin composition. When the silane-based coupling agent is included within the range, close-contacting properties, storage properties, or the like, may be improved.

The photosensitive resin composition may further include a surfactant, for example, a fluorine-based surfactant and/or a silicone-based surfactant, in order to improve coating properties and prevent a defects.

Examples of the fluorine-based surfactant may be a commercial fluorine-based surfactant such as BM-1000®, and BM-110® (BM Chemie Inc.), MEGAFACE F 142D®, F 172®, F 173®, F 183® and F 554® (Dainippon Ink Kagaku Kogyo Co., Ltd.), FULORAD FC-135®, FULORAD FC-170C®, FULORAD FC-430®, and FULORAD FC-431® (Sumitomo 3M Co., Ltd.), SURFLON S-112®, SURFLON S-113®, SURFLON S-131®, SURFLON S-141®, and SURFLON S-145® (Asahi Glass Co., Ltd.), and SH-28PA®, SH-190®, SH-193®, SZ-6032®, and SF-8428®, or the like (Toray Silicone Co., Ltd.).

The silicone-based surfactant may be BYK-307, BYK-333, BYK-361N, BYK-051, BYK-052, BYK-053, BYK-067A, BYK-077, BYK-301, BYK-322, BYK-325, and or like, which are made by BYK Chem and commercially available.

The surfactant may be used in an amount of about 0.001 to about 5 parts by weight based on 100 parts by weight of the photosensitive resin composition. When the surfactant is included within the range, excellent wetting on an IZO substrate or a glass substrate, as well as coating uniformity, may be secured, and a stain may not be produced.

In addition, the photosensitive resin composition may include other additives such as an antioxidant, a stabilizer, or the like, in a predetermined amount, provided that the other additives do not deteriorate properties of the photosensitive resin composition.

The photosensitive resin composition according to an embodiment may be either a positive or a negative photosensitive composition. For example, the photosensitive resin composition may be a negative composition such that residues in regions where a pattern is exposed may be completely removed after exposing and the composition may be developed to have light-blocking properties.

Another embodiment provides a black photosensitive resin layer manufactured by exposure, development, and curing of the photosensitive resin composition.

A method of manufacturing the black photosensitive resin layer is as follows.

(1) Coating and Film Formation

The photosensitive resin composition may be coated to have a desired thickness on a substrate such as a glass substrate or a IZO or ITO substrate that has undergone a predetermined pretreatment, using a spin or slit coating method, a roll coating method, a screen-printing method, an applicator method, or the like. The coated photosensitive resin composition may be dried at room temperature (about 15° C. to about 30° C.) under a reduced pressure (VCD).

Then, the resultant may be heated at about 70° C. to about 100° C. for 1 minute to 10 minutes to remove a solvent, forming a photosensitive resin layer.

(2) Exposure

The photosensitive resin film may be patterned by disposing a mask and then, radiating an actinic ray having a wavelength ranging from about 200 nm to about 500 nm. The radiation may be performed by using a light source such as a mercury lamp with a low pressure, a high pressure, or an ultrahigh pressure, a metal halide lamp, an argon gas laser, or the like. An X ray, an electron beam, or the like, may be also used.

The light dose may vary depending on kinds of each component, its combination ratio, and a dry film thickness. For example, the exposure process may provide a light dose of about 500 mJ/cm$^2$ or less (with a 365 nm sensor) when a high pressure mercury lamp is used.

(3) Development

After the exposure process, an alkali aqueous solution may be used to develop the exposed film by dissolving and removing an undesired part and leaving the exposed part, forming a pattern.

(4) Post-treatment

The developed image pattern may be post-heated in order to provide excellent quality in terms of heat resistance, photo resistance, close contacting properties, crack-resistance, chemical resistance, high strength, storage stability, or the like. For example, after development, heat-treatment may be performed under a nitrogen atmosphere in a convection oven of about 250° C. for about 1 hour.

Another embodiment provides a display device including the black photosensitive resin layer.

The display device may be an organic light emitting diode (OLED).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Synthesis of Second Binder Resin

Synthesis Example 1

86.6 g of N-methyl-2-pyrrolidone (NMP) was put into a four-necked flask equipped with an agitator, a thermostat, a nitrogen gas injector, and a cooler, while nitrogen was passed through the flask, and 12.3 g of 4,4'-(hexafluoroisopropylidene) diphthalic anhydride (6-FDA) was added thereto and dissolved therein. When a solid was completely dissolved, 3.25 g of 3-aminophenyl sulfone (3-DAS) was added thereto, and the mixture was stirred at room temperature for 2 hours. Subsequently, the resultant was heated up to 90° C., 5.6 g of pyridine, 2.05 g of acetic anhydride (A$_2$CO) were added thereto, and the obtained mixture was stirred for 3 hours. A temperature inside the reactor was decreased to room temperature, 1.6 g of 2-hydroethylmethacrylate (HEMA) was added thereto, and the mixture was stirred for 6 hours. Subsequently, 3.25 g of 3-aminophenyl sulfone (3-DAS) was added thereto, and the mixture was reacted for 6 hours, completing the reaction. The reaction mixture was put into water to generate a precipitate, and the precipitate was filtered, sufficiently cleaned with water, and dried at 50° C. under a vacuum condition for 24 hours to obtain a polyamic acid-polyimide copolymer as the second binder resin. A weight average molecular weight that is reduced to standard polystyrene through GPC (Gel Permeation Chromatography) of the copolymer was 7,500 g/mol, polydispersity of the copolymer was 1.75, and a glass transition temperature of the copolymer was 200° C. (a mole ratio of a polyimide unit and a polyamic acid unit=50:50)

Preparation of Photosensitive Resin Composition

Examples 1 to 38 and Comparative Examples 1 to 3

A photopolymerization initiator was dissolved in a solvent to have a composition shown in Table 1, and the solution was stirred at room temperature for 2 hours. A binder resin and a photopolymerizable monomer were added thereto, and the mixture was stirred at room temperature for one hour. Then, a fluorine-based surfactant (other additives) and a black colorant were added thereto, the obtained mixture was stirred for 1 hour at room temperature, and a solution obtained therefrom was entirely stirred for 2 hours. The solution was three times filtered to remove impurities and prepare a photosensitive resin composition.

TABLE 1

(unit: g)

| | Binder resin | | Black colorant | | Photopolymerizable monomer | | Photopolymerization initiator | | Solvent | |
|---|---|---|---|---|---|---|---|---|---|---|
| | A-1 | A-2 | B-1 | B-2 | C-1 | C-2 | D-1 | D-2 | E-1 | E-2 |
| Example 1 | 0.2 (A-1-1) | 4.2 | 40 | — | 0.7 | 0.7 | 0.4 | 0.4 | 30 | 24 |
| Example 2 | 1.3 (A-1-1) | 3.1 | 40 | — | 0.7 | 0.7 | 0.4 | 0.4 | 30 | 24 |
| Example 3 | 3.5 (A-1-1) | 0.9 | 40 | — | 0.7 | 0.7 | 0.4 | 0.4 | 30 | 24 |
| Example 4 | 0.2 (A-1-2) | 4.2 | 40 | — | 0.7 | 0.7 | 0.4 | 0.4 | 30 | 24 |
| Example 5 | 1.3 (A-1-2) | 3.1 | 40 | — | 0.7 | 0.7 | 0.4 | 0.4 | 30 | 24 |
| Example 6 | 3.5 (A-1-2) | 0.9 | 40 | — | 0.7 | 0.7 | 0.4 | 0.4 | 30 | 24 |
| Example 7 | 0.2 (A-1-3) | 4.2 | 40 | — | 0.7 | 0.7 | 0.4 | 0.4 | 30 | 24 |
| Example 8 | 1.3 (A-1-3) | 3.1 | 40 | — | 0.7 | 0.7 | 0.4 | 0.4 | 30 | 24 |
| Example 9 | 3.5 (A-1-3) | 0.9 | 40 | — | 0.7 | 0.7 | 0.4 | 0.4 | 30 | 24 |
| Example 10 | 3.5 (A-1-4) | 0.9 | 40 | — | 0.7 | 0.7 | 0.4 | 0.4 | 30 | 24 |
| Example 11 | 3.5 (A-1-5) | 0.9 | 40 | — | 0.7 | 0.7 | 0.4 | 0.4 | 30 | 24 |
| Example 12 | 0.2 (A-1-6) | 4.2 | 40 | — | 0.7 | 0.7 | 0.4 | 0.4 | 30 | 24 |
| Example 13 | 1.3 (A-1-6) | 3.1 | 40 | — | 0.7 | 0.7 | 0.4 | 0.4 | 30 | 24 |
| Example 14 | 3.5 (A-1-6) | 0.9 | 40 | — | 0.7 | 0.7 | 0.4 | 0.4 | 30 | 24 |
| Example 15 | 0.2 (A-1-7) | 4.2 | 40 | — | 0.7 | 0.7 | 0.4 | 0.4 | 30 | 24 |
| Example 16 | 1.3 (A-1-7) | 3.1 | 40 | — | 0.7 | 0.7 | 0.4 | 0.4 | 30 | 24 |
| Example 17 | 3.5 (A-1-7) | 0.9 | 40 | — | 0.7 | 0.7 | 0.4 | 0.4 | 30 | 24 |
| Example 18 | 0.2 (A-1-8) | 4.2 | 40 | — | 0.7 | 0.7 | 0.4 | 0.4 | 30 | 24 |
| Example 19 | 1.3 (A-1-8) | 3.1 | 40 | — | 0.7 | 0.7 | 0.4 | 0.4 | 30 | 24 |
| Example 20 | 3.5 (A-1-8) | 0.9 | 40 | — | 0.7 | 0.7 | 0.4 | 0.4 | 30 | 24 |
| Example 21 | 0.2 (A-1-9) | 4.2 | 40 | — | 0.7 | 0.7 | 0.4 | 0.4 | 30 | 24 |
| Example 22 | 1.3 (A-1-9) | 3.1 | 40 | — | 0.7 | 0.7 | 0.4 | 0.4 | 30 | 24 |
| Example 23 | 3.5 (A-1-9) | 0.9 | 40 | — | 0.7 | 0.7 | 0.4 | 0.4 | 30 | 24 |
| Example 24 | 0.2 (A-1-10) | 4.2 | 40 | — | 0.7 | 0.7 | 0.4 | 0.4 | 30 | 24 |
| Example 25 | 1.3 (A-1-10) | 3.1 | 40 | — | 0.7 | 0.7 | 0.4 | 0.4 | 30 | 24 |
| Example 26 | 3.5 (A-1-10) | 0.9 | 40 | — | 0.7 | 0.7 | 0.4 | 0.4 | 30 | 24 |

TABLE 1-continued (unit: g)

| | Binder resin | | Black colorant | | Photopolymerizable monomer | | Photopolymerization initiator | | Solvent | |
|---|---|---|---|---|---|---|---|---|---|---|
| | A-1 | A-2 | B-1 | B-2 | C-1 | C-2 | D-1 | D-2 | E-1 | E-2 |
| Example 27 | 0.2 (A-1-11) | 4.2 | 40 | — | 0.7 | 0.7 | 0.4 | 0.4 | 30 | 24 |
| Example 28 | 1.3 (A-1-11) | 3.1 | 40 | — | 0.7 | 0.7 | 0.4 | 0.4 | 30 | 24 |
| Example 29 | 3.5 (A-1-11) | 0.9 | 40 | — | 0.7 | 0.7 | 0.4 | 0.4 | 30 | 24 |
| Example 30 | 0.2 (A-1-12) | 4.2 | 40 | — | 0.7 | 0.7 | 0.4 | 0.4 | 30 | 24 |
| Example 31 | 1.3 (A-1-12) | 3.1 | 40 | — | 0.7 | 0.7 | 0.4 | 0.4 | 30 | 24 |
| Example 32 | 3.5 (A-1-12) | 0.9 | 40 | — | 0.7 | 0.7 | 0.4 | 0.4 | 30 | 24 |
| Example 33 | 0.2 (A-1-1) | 4.2 | 25 | 6.8 | 0.7 | 0.7 | 0.4 | 0.4 | 38.2 | 24 |
| Example 34 | 1.3 (A-1-1) | 3.1 | 25 | 7.6 | 0.7 | 0.7 | 0.4 | 0.4 | 37.4 | 24 |
| Example 35 | 3.5 (A-1-1) | 0.9 | 29 | 7.6 | 0.7 | 0.7 | 0.4 | 0.4 | 33.4 | 24 |
| Example 36 | 0.2 (A-1-2) | 4.2 | 31 | 7.6 | 0.7 | 0.7 | 0.4 | 0.4 | 31.4 | 24 |
| Example 37 | 1.3 (A-1-2) | 3.1 | 33 | 7.6 | 0.7 | 0.7 | 0.4 | 0.4 | 29.4 | 24 |
| Example 38 | 3.5 (A-1-2) | 0.9 | 35 | 7.6 | 0.7 | 0.7 | 0.4 | 0.4 | 27.4 | 24 |
| Comparative Example 1 | — | 4.4 | 40 | — | 0.7 | 0.7 | 0.4 | 0.4 | 30 | 24 |
| Comparative Example 2 | — | 4.4 | 40 | — | 0.7 | 0.7 | 0.4 | 0.4 | 30 | 24 |
| Comparative Example 3 | 4.4 (A-1-1) | — | 40 | — | 0.7 | 0.7 | 0.4 | 0.4 | 30 | 24 |

(A) Binder resin
(A-1): First binder resin
(A-1-1): polyurethane-based resin (1185A, BASF Corp., Tg: −42° C.)
(A-1-2): polyurethane-based resin (1164D, BASF Corp., Tg: −7° C.)
(A-1-3): polyurethane-based resin (1180, KURARAY Inc., Tg: −37° C.)
(A-1-4): polyurethane-based resin (1190, KURARAY Inc., Tg: −32° C.)
(A-1-5): polyurethane-based resin (1195, KURARAY Inc., Tg: −21° C.)
(A-1-6): cardo-based resin (KBR-101, Kyung-In Synthetic Corporation, Tg: 40° C.)
(A-1-7): epoxy-based resin (JER1001, Chemical Formula 7-1, Japan Epoxy Resins Co., Ltd., Tg: 65° C.)
(A-1-8): epoxy-based resin (EPPN-501H, Chemical Formula 8-1, Nippon Kayaku, Tg: 53° C.)
(A-1-9): styrene-based resin (including repeating units represented by Chemical Formulae 10 and 11 (self-polymerization), weight average molecular weight: 8,500 g/mol, self-polymerization, Tg: 109° C.)
(A-1-10): acryl-based resin (Newcoat UVA-101, Shin-Nakamura Chemical Co., Ltd., Tg: 0° C.)
(A-1-11): bisphenol A-based resin (PC, PolymerTechnology&Services, Tg: 145° C.)
(A-1-12): siloxane-based resin (SOG-B1, Samyang Corp., Tg: -30° C.)
(A-2): second binder resin (polyamic acid-polyimide copolymer of Synthesis Example 1)
(B) Black colorant
(B-1): organic black pigment dispersion liquid (CI-IM-126, SAKATA Corp.; organic black pigment solid 15 wt %)
(B-2): carbon black dispersion liquid (BK-6912, TOKUSIKI Co., Ltd.; carbon black solid 20 wt %)
(C) Photopolymerizable monomer
(C-1): dipentaerythritol hexa(meth)acrylate (DPHA, Nippon Kayaku Co. Ltd.)
(C-2): compound represented by Chemical Formula A (LTM II, BASF Corp.)
[Chemical Formula A]

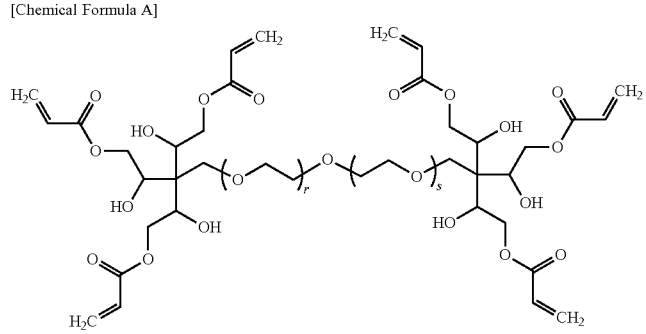

(in Chemical Formula A, r and s are independently an integer of 2)
(D) Photopolymerization initiator
(D-1) oxime-based initiator (NCI-831, ADEKA Corp.)

TABLE 1-continued (unit: g)

| Binder resin | | Black colorant | | Photopoly merizable monomer | | Photopoly merization initiator | | Solvent | |
|---|---|---|---|---|---|---|---|---|---|
| A-1 | A-2 | B-1 | B-2 | C-1 | C-2 | D-1 | D-2 | E-1 | E-2 |

(D-2) oxime-based initiator (IRG-819, BASF Corp.)
(E) Solvent
(E-1) propylene glycol monomethyl ether acetate (Sigma-Aldrich Corp.)
(E-2) diethylene glycol ethylmethyl ether (Sigma-Aldrich Corp.)

Evaluation 1: Sensitivity

The photosensitive resin compositions according to Examples 1 to 38 and Comparative Examples 1 to 3 were respectively coated onto a 10 cm*10 cm ITO glass (resistance 30Ω). Then, the coated photosensitive resin compositions were heated by proximity-type heating on a 100° C. hot plate for 1 minute and contact type-heated for 1 minute again to respectively form 1.2 μm-thick photosensitive resin layers. The substrates respectively coated with the photosensitive resin layers were exposed to light by using a mask having variously-sized patterns and changing a light dose with UX-1200SM-AKS02 (Ushio Inc.), developed at room temperature in a 2.38% TMAH solution to dissolve and remove an exposed region, and cleaned with pure water for 50 seconds to form a pattern.

Sensitivity was evaluated by measuring energy realizing a 20 μm pattern with a reference to a size of a 20 μm square pattern measured by using MX51T-N633MU made by Olympus Corp., and the results are shown in Table 2.

Evaluation 2: Taper Angle

The wafers used in Evaluation 1 were cured at 250° C. for 1 hour, their taper angles were measured by using a S-4300 FE-SEM equipment made by Hitachi, Ltd., and the results are shown in Table 2.

Evaluation 3: Near Infrared Ray (NIR) Transmittance (@880 nm)

The photosensitive resin compositions according to Examples 1 to 38 and Comparative Examples 1 to 3 were respectively coated onto a 10 cm*10 cm ITO glass (30Ω) and then heated by proximity-type heating on a 100° C. hot plate for 1 minute and contact type-heated for 1 minute again to respectively form 1.2 μm-thick photosensitive resin layers. Transmittance of the photosensitive resin layers at 880 nm was measured by using Cary series UV-Vis-NIR Spectrophotometer made by Agilent Technologies, and the results are shown in Table 2.

Evaluation 4: Optical Density

The photosensitive resin compositions according to Examples 1 to 38 and Comparative Examples 1 to 3 were respectively coated on a 10 cm*10 cm ITO glass (30Ω) and then, heated by proximity-type-heating on a 100° C. hot plate for 1 minute and contact type-heated for 1 minute again to respectively form 1.2 μm-thick photosensitive resin layers. The photosensitive resin layers were cured at 250° C. for 1 hour, the optical density per μm of the cured layers was measured with X-rite. The results are shown in Table 2.

TABLE 2

| | Sensitivity (mJ/cm²) | Taper angle (°) | Near infrared ray transmittance (@880 nm) (%) | Optical density (/μm) |
|---|---|---|---|---|
| Example 1 | 80 | 68 | 92 | 1.3 |
| Example 2 | 80 | 45 | 92 | 1.3 |
| Example 3 | 80 | 38 | 92 | 1.3 |
| Example 4 | 80 | 70 | 92 | 1.3 |
| Example 5 | 80 | 50 | 92 | 1.3 |
| Example 6 | 80 | 40 | 92 | 1.3 |
| Example 7 | 80 | 71 | 92 | 1.3 |
| Example 8 | 80 | 52 | 92 | 1.3 |
| Example 9 | 80 | 42 | 92 | 1.3 |
| Example 10 | 80 | 42 | 92 | 1.3 |
| Example 11 | 80 | 43 | 92 | 1.3 |
| Example 12 | 70 | 68 | 92 | 1.3 |
| Example 13 | 65 | 45 | 92 | 1.3 |
| Example 14 | 65 | 40 | 92 | 1.3 |
| Example 15 | 80 | 69 | 92 | 1.3 |
| Example 16 | 80 | 49 | 92 | 1.3 |
| Example 17 | 80 | 41 | 92 | 1.3 |
| Example 18 | 80 | 71 | 92 | 1.3 |
| Example 19 | 80 | 55 | 92 | 1.3 |
| Example 20 | 80 | 48 | 92 | 1.3 |
| Example 21 | 80 | 77 | 92 | 1.3 |
| Example 22 | 80 | 54 | 92 | 1.3 |
| Example 23 | 80 | 45 | 92 | 1.3 |
| Example 24 | 80 | 72 | 92 | 1.3 |
| Example 25 | 80 | 51 | 92 | 1.3 |
| Example 26 | 80 | 42 | 92 | 1.3 |
| Example 27 | 80 | 80 | 92 | 1.3 |
| Example 28 | 80 | 75 | 92 | 1.3 |
| Example 29 | 80 | 60 | 92 | 1.3 |
| Example 30 | 80 | 71 | 92 | 1.3 |
| Example 31 | 80 | 55 | 92 | 1.3 |
| Example 32 | 80 | 48 | 92 | 1.3 |
| Example 33 | 80 | 65 | 35 | 1.4 |
| Example 34 | 80 | 48 | 32 | 1.5 |
| Example 35 | 80 | 42 | 32 | 1.5 |
| Example 36 | 80 | 68 | 32 | 1.6 |
| Example 37 | 80 | 50 | 33 | 1.7 |
| Example 38 | 80 | 45 | 33 | 1.8 |
| Comparative Example 1 | 80 | T-top profile* | 92 | 1.3 |
| Comparative Example 2 | 80 | T-top profile* | 92 | 1.3 |
| Comparative Example 3 | | Lifting** | | |

*T-top profile: T-shaped pattern
**Lifting: pattern not left but torn apart after development Referring to Table 2, a photosensitive resin composition according to an embodiment includes a first binder resin having a glass transition temperature of about −50° C. to about 150° C. and a second binder resin having a glass transition temperature of greater than about 150° C. Thus, the photosensitive resin composition may provide improved sensitivity and taper characteristics. Furthermore, when an organic black pigment and carbon black are used together as a black colorant, light-blocking properties may be further improved.

By way of summation and review, it is desirable that a photosensitive resin layer such as a pixel barrier rib layer or the like used as a material for a display device panel have a small taper angle to secure processability and device reliability. In addition, it is desirable that a colorant such as a pigment, a dye, or the like, that absorbs light in a visible ray region be used in order to secure light-blocking properties.

However, with a general colorant such as a pigment, a dye, or the like, a taper angle may increase after a curing process.

Embodiments provide a photosensitive resin composition having improved sensitivity and taper characteristics, a photosensitive resin layer manufactured using the photosensitive resin composition, and a display device including the photosensitive resin layer.

For example, a photosensitive resin composition according to an embodiment may include a binder resin having a glass transition temperature of about −50° C. to about 150° C. and a binder resin having a glass transition temperature of greater than about 150° C. Thus, the photosensitive resin composition may avoid an increase of a taper angle after a curing process and may secure excellent sensitivity, development margin, and light-blocking properties as well as excellent processability and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A photosensitive resin composition, comprising:
a binder resin;
a black colorant;
a photopolymerizable monomer;
a photopolymerization initiator; and
a solvent,
wherein:
the binder resin includes a first binder resin having a glass transition temperature of about −50° C. to about 150° C. and a second binder resin having a glass transition temperature of greater than about 150° C., wherein the second binder resin includes at least one selected from a polyamic acid polymer, a polyamic acid ester polymer, a polyhydroxyamide polymer, a polybenzoxazole polymer, and a polyamic acid-polyimide copolymer, provided that when the second binder resin includes a polyamic acid-polyimide copolymer, the polyamic acid-polyimide copolymer has a molecular weight of about 3,000 g/mol to about 10,000 g/mol, and the first binder resin is included in an amount of about 1 part by weight to about 900 parts by weight based on 100 parts by weight of the second binder resin.

2. The photosensitive resin composition as claimed in claim 1, wherein the first binder resin is included in an amount of about 100 parts by weight to about 800 parts by weight based on 100 parts by weight of the second binder resin.

3. The photosensitive resin composition as claimed in claim 1, wherein the first binder resin includes a polyurethane-based resin, a cardo-based resin, an epoxy-based resin, a styrene-based resin, an acryl-based resin, a bisphenol A-based resin, a siloxane-based resin, or a combination thereof.

4. The photosensitive resin composition as claimed in claim 1, wherein when the second binder resin includes a polyamic polyimide copolymer:
the polyamic acid-polyimide copolymer includes a polyamic acid repeating unit and a polyimide repeating unit, and
the polyamic acid repeating unit and the polyimide repeating unit are included in a mole ratio of about 5:5 to about 9:1.

5. The photosensitive resin composition as claimed in claim 1, wherein the binder resin and the photopolymerizable monomer are included in a weight ratio of about 55:45 to about 99:1.

6. A photosensitive resin composition, comprising:
a binder resin;
a black colorant;
a photopolymerizable monomer;
a photopolymerization initiator; and
a solvent,
wherein:
the binder resin includes a first binder resin having a glass transition temperature of about −50° C. to about 150° C. and a second binder resin having a glass transition temperature of greater than about 150° C., and
the photopolymerizable monomer includes a compound including at least two functional groups represented by Chemical Formula 1:

[Chemical Formula 1]

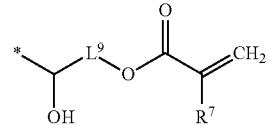

wherein, in Chemical Formula 1, $R^7$ is a hydrogen atom or a substituted or unsubstituted C1 to C10 alkyl group, and
$L^9$ is a single bond or a substituted or unsubstituted C1 to C10 alkylene group.

7. The photosensitive resin composition as claimed in claim 6, wherein the compound including at least two functional groups represented by Chemical Formula 1 is a compound represented by Chemical Formula 2 or Chemical Formula 3:

[Chemical Formula 2]

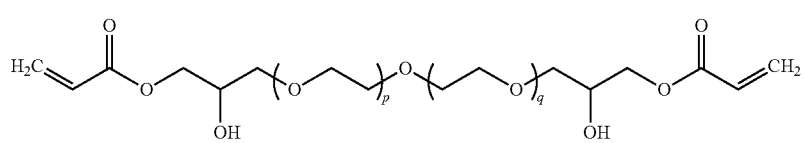

-continued

[Chemical Formula 3]

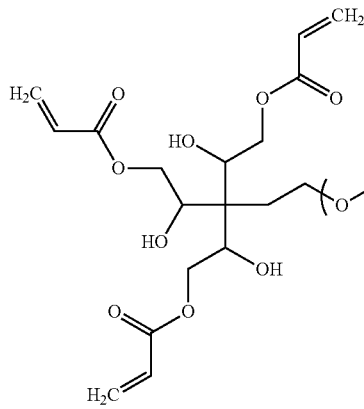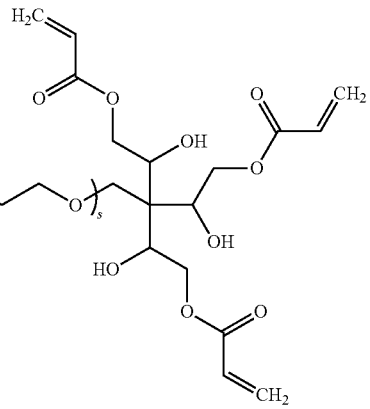

wherein, in Chemical Formula 2 and Chemical Formula 3, p, q, r, and s are independently an integer ranging from 1 to 10.

8. A photosensitive resin composition, comprising:
a binder resin;
a black colorant;
a photopolymerizable monomer;
a photopolymerization initiator; and
a solvent,
wherein:
the binder resin includes a first binder resin having a glass transition temperature of about −50° C. to about 150° C. and a second binder resin having a glass transition temperature of greater than about 150° C., and wherein the black colorant includes an organic black pigment and carbon black, and
the carbon black is included in an amount of about 10 parts by weight to about 60 parts by weight based on 100 parts by weight of the organic black pigment.

9. The photosensitive resin composition as claimed in claim 1, wherein the photosensitive resin composition includes about 1 wt % to about 10 wt % of the binder resin;
about 1 wt % to about 20 wt % of the black colorant;
about 0.3 wt % to about 10 wt % of the photopolymerizable monomer;
about 0.1 wt % to about 5 wt % of the photopolymerization initiator; and
a balance amount of the solvent
based on a total amount of the photosensitive resin composition.

10. A photosensitive resin layer manufactured using the photosensitive resin composition as claimed in claim 1.

11. A display device comprising the photosensitive resin layer as claimed in claim 10.

12. The display device as claimed in claim 11, wherein the display device is an organic light emitting diode (OLED).

13. A display device comprising a photosensitive resin layer manufactured using the photosensitive resin composition as claimed in claim 6.

14. A display device comprising a photosensitive resin layer manufactured using the photosensitive resin composition as claimed in claim 8.

* * * * *